United States Patent
Okabe

(10) Patent No.: US 12,205,858 B2
(45) Date of Patent: Jan. 21, 2025

(54) ELECTRONIC COMPONENT MODULE AND METHOD FOR MANUFACTURING ELECTRONIC COMPONENT MODULE

(71) Applicant: Murata Manufacturing Co., Ltd., Nagaokakyo (JP)

(72) Inventor: Ryohei Okabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 407 days.

(21) Appl. No.: 17/653,703

(22) Filed: Mar. 7, 2022

(65) Prior Publication Data

US 2022/0189838 A1 Jun. 16, 2022

Related U.S. Application Data

(63) Continuation of application No. PCT/JP2020/033361, filed on Sep. 3, 2020.

(30) Foreign Application Priority Data

Sep. 12, 2019 (JP) .................................. 2019-165804

(51) Int. Cl.
*H01L 23/31* (2006.01)
*H01L 21/56* (2006.01)
(Continued)

(52) U.S. Cl.
CPC .............. *H01L 23/31* (2013.01); *H01L 21/56* (2013.01); *H01L 23/544* (2013.01);
(Continued)

(58) Field of Classification Search
CPC ....... H01L 23/31; H01L 21/56; H01L 23/544; H01L 23/552; H01L 24/16; H01L 24/32;
(Continued)

(56) References Cited

U.S. PATENT DOCUMENTS

| 2005/0167800 A1* | 8/2005 | Naya | H01L 23/544 |
| | | | 257/E23.179 |
| 2015/0262981 A1* | 9/2015 | Yap | H01L 23/49548 |
| | | | 29/830 |

(Continued)

FOREIGN PATENT DOCUMENTS

| JP | 2001085285 A | * 3/2001 | ........... H01L 23/544 |
| JP | 2005-203695 A | 7/2005 | |

(Continued)

OTHER PUBLICATIONS

International Search Report for PCT/JP2020/033361 dated Nov. 24, 2020.

*Primary Examiner* — S M Sohel Imtiaz
(74) *Attorney, Agent, or Firm* — Pearne & Gordon LLP

(57) ABSTRACT

An electronic component module includes a substrate, a mounting-type electronic component, a mounting-type electronic component, an insulating resin, and an insulating resin. The mounting-type electronic component is mounted on a first main surface of the substrate. The mounting-type electronic component is mounted on a second main surface of the substrate. The insulating resin covers the first main surface and the first mounting-type electronic component. The insulating resin covers the second main surface and the second mounting-type electronic component. The first mounting-type electronic component is an electronic component including a semiconductor substrate. A top surface of the semiconductor substrate of the first mounting-type electronic component opposite to the first main surface is exposed from the insulating resin. Printing is applied to the top surface, which is an exposed surface of the semiconductor substrate.

9 Claims, 5 Drawing Sheets

(51) Int. Cl.
  *H01L 23/00* (2006.01)
  *H01L 23/544* (2006.01)
  *H01L 23/552* (2006.01)
  *H01L 25/065* (2023.01)
  *H01L 25/16* (2023.01)

(52) U.S. Cl.
  CPC ............ *H01L 23/552* (2013.01); *H01L 24/16* (2013.01); *H01L 24/32* (2013.01); *H01L 24/73* (2013.01); *H01L 25/0657* (2013.01); *H01L 25/165* (2013.01); *H01L 2223/54453* (2013.01); *H01L 2224/16227* (2013.01); *H01L 2224/32225* (2013.01); *H01L 2224/73204* (2013.01); *H01L 2225/06517* (2013.01); *H01L 2225/06572* (2013.01)

(58) Field of Classification Search
  CPC ... H01L 24/73; H01L 25/0657; H01L 25/165; H01L 2224/73204; H01L 25/16; H01L 23/3121
  See application file for complete search history.

(56) References Cited

U.S. PATENT DOCUMENTS

| | | | |
|---|---|---|---|
| 2018/0077802 A1* | 3/2018 | Kidoguchi | H05K 1/0298 |
| 2018/0166394 A1* | 6/2018 | Otsubo | H01L 23/552 |
| 2018/0323170 A1* | 11/2018 | Kim | H01L 21/56 |
| 2019/0304862 A1* | 10/2019 | Lu | H01L 23/5389 |
| 2020/0058599 A1 | 2/2020 | Okada et al. | |
| 2020/0203288 A1 | 6/2020 | Otsubo et al. | |

FOREIGN PATENT DOCUMENTS

| | | |
|---|---|---|
| JP | 2013-074218 A | 4/2013 |
| JP | 2018-195756 A | 12/2018 |
| WO | 2016/181706 A1 | 11/2016 |
| WO | 2017/026430 A1 | 2/2017 |
| WO | 2018/198856 A1 | 11/2018 |
| WO | 2019/045088 A1 | 3/2019 |

* cited by examiner

ELECTRONIC COMPONENT MODULE AND METHOD FOR MANUFACTURING ELECTRONIC COMPONENT MODULE

This is a continuation of International Application No. PCT/JP2020/033361 filed on Sep. 3, 2020 which claims priority from Japanese Patent Application No. 2019-165804 filed on Sep. 12, 2019. The contents of these applications are incorporated herein by reference in their entireties.

BACKGROUND OF THE DISCLOSURE

Field of the Disclosure

The present disclosure relates to an electronic component module in which an electronic component is mounted on a substrate.

Description of the Related Art

Patent Literature 1 describes a high-frequency module in which an electronic component is mounted on a main surface of a multilayer wiring substrate. A semiconductor element and a chip component are mounted on the main surface of the substrate.

The main surface of the substrate is covered with a sealing resin. The surface of the sealing resin and the side surface of the substrate are covered with a shield film.

Patent Literature 1

WO 2017/026430

BRIEF SUMMARY OF THE DISCLOSURE

In the high-frequency module having the conventional configuration as shown in Patent Literature 1, a product lot and the like are printed on the surface of a sealing resin. For this reason, the sealing resin requires a thickness equivalent to a printed part, and as a result, the high-frequency module (electronic component module) becomes large by this amount.

Therefore, an object of the present disclosure is to provide a small electronic component module capable of applying printing.

An electronic component module of this disclosure includes a substrate, a first electronic component, and a first insulating resin. The substrate has a first main surface and a second main surface, and a side of the second main surface is a mounting side. The first electronic component is mounted on the first main surface. The first insulating resin covers the first main surface and the first electronic component. The first electronic component is an electronic component including a semiconductor. A surface of the semiconductor of the first electronic component opposite to a surface facing the first main surface is exposed from the first insulating resin. Printing is applied to an exposed surface of the semiconductor.

In this configuration, the thickness of the first insulating resin needs not be increased for printing. This reduces the thickness of the substrate on the side of the first main surface.

According to this disclosure, it is possible to miniaturize an electronic component module capable of applying printing.

DETAILED DESCRIPTION OF THE DISCLOSURE

First Embodiment

Figure 1:
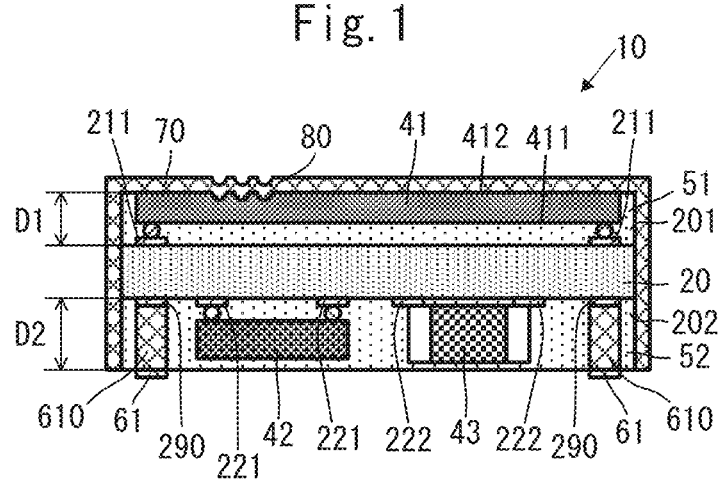
FIG. 1 is a side sectional view showing a configuration of an electronic component module according to a first embodiment.

An electronic component module according to the first embodiment of the present disclosure will be described with reference to the drawings. FIG. 1 is a side sectional view showing the configuration of the electronic component module according to the first embodiment.

As shown in FIG. 1, an electronic component module 10 includes a substrate 20, a mounting-type electronic component 41, a mounting-type electronic component 42, a mounting-type electronic component 43, an insulating resin 51, an insulating resin 52, a plurality of terminal conductors 61, a plurality of columnar conductors 610, and a shield film 70.

The substrate 20 has an insulating body and includes a conductor pattern for achieving the electronic component module 10. The substrate 20 is formed by, for example, stacking a plurality of insulator layers on which a predetermined conductor pattern is formed. Note that illustration of the conductor pattern formed inside the substrate 20 is omitted. The substrate 20 is, for example, a rectangular flat plate, and has a first main surface 201 and a second main surface 202 facing each other. The substrate 20 is a ceramic multilayer substrate. The substrate 20 may be a resin multilayer substrate.

The first main surface 201 of the substrate 20 is provided with a plurality of land conductors 211. The number and arrangement of the land conductors 211 correspond to the number and arrangement of terminals of the mounting-type electronic component 41.

The second main surface 202 of the substrate 20 is provided with a plurality of land conductors 221, a plurality of land conductors 222, and a plurality of external connection terminal conductors 290. The number and arrangement of the plurality of land conductors 221 correspond to the number and arrangement of terminals of the mounting-type electronic component 42. The number and arrangement of the plurality of land conductors 222 correspond to the number and arrangement of terminals of the mounting-type electronic component 43. The plurality of external connection terminal conductors 290 are arranged along an outer peripheral end in the vicinity of the outer peripheral end on the second main surface 202 of the substrate 20. Note that the plurality of external connection terminal conductors 290 need not necessarily be arranged along the outer peripheral end of the substrate, and may be arranged, for example, between the mounting-type electronic component 42 and the mounting-type electronic component 43.

The mounting-type electronic component 41 is an electronic component including a semiconductor, for example. The mounting-type electronic component 41 is an electronic component that can be thinned by grinding a top surface 412 opposite to the side of a mounting surface 411. For example, the mounting-type electronic component 41 is a so-called bare chip semiconductor IC that is not molded in advance with an insulating resin or the like. The mounting-type electronic component 41 corresponds to the "first electronic component" of the present disclosure.

The mounting-type electronic component 42 and the mounting-type electronic component 43 are, for example, electronic components that cannot be ground and cannot be thinned. The mounting-type electronic component 42 is, for example, a resin-molded active element (such as a transistor), a chip capacitor element, a chip inductor element, a chip resistance element, or the like. The mounting-type electronic component 42 and the mounting-type electronic component 43 correspond to the "second electronic component" of the present disclosure.

The mounting-type electronic component 41 is joined (mounted) to the land conductor 211 using solder or the like. The mounting-type electronic component 42 is joined (mounted) to the land conductor 221 using solder or the like. The mounting-type electronic component 43 is joined (mounted) to the land conductor 222 using solder or the like.

The columnar conductor 610 is made of metal such as copper. The plurality of columnar conductors 610 are joined (mounted) to the plurality of external connection terminal conductors 290 using solder or the like. The columnar conductor 610 is a projecting electrode, a metal pin, plating, or the like. A solder bump may be used instead of the columnar conductor.

The insulating resin 51 covers the first main surface 201 of the substrate 20 and the mounting-type electronic component 41. The insulating resin 51 covers the mounting surface 411 and the side surface of the mounting-type electronic component 41. In other words, the top surface 412 of the mounting-type electronic component 41 is exposed to the outside from the insulating resin 51. At this time, the top surface 412 of the mounting-type electronic component 41 is flush with, but may slightly protrude from, the surface of the insulating resin 51 opposite to a contact surface with the first main surface 201. The insulating resin 51 corresponds to the "first insulating resin" of the present disclosure.

The insulating resin 52 covers the second main surface 202 of the substrate 20 and the mounting-type electronic component 42. The insulating resin 52 covers the mounting-type electronic component 42, the mounting-type electronic component 43, and the columnar conductor 610. The insulating resin 52 corresponds to the "second insulating resin" of the present disclosure.

By including the insulating resin 51 and the insulating resin 52, the mounting-type electronic component 41, the mounting-type electronic component 42, the mounting-type electronic component 43, and the conductor patterns formed on the first main surface 201 and the second main surface 202 of the substrate 20 can be protected from the external environment.

The terminal conductor 61 is formed on a surface of the columnar conductor 610 opposite to the joining surface with the external connection terminal conductor 290. The terminal conductor 61 serves as a terminal for mounting the electronic component module 10 on another circuit board. That is, in the electronic component module 10, the side of the second main surface 202 of the substrate 20 is a mounting side onto another circuit board.

The shield film 70 is a conductive film. The shield film 70 covers the entire outer surface of insulating resin 51, the top surface 412 of the mounting-type electronic component 41, the entire side surface of the substrate 20, and the entire side surface of the insulating resin 52. By disposing the shield film 70 in this manner, it is possible to suppress unnecessary coupling and interference between the mounting-type electronic component 41, the mounting-type electronic component 42, the mounting-type electronic component 43, the substrate 20 and the electrical configuration formed on and the external environment. The shield film 70 is connected to the ground potential. This is achieved, for example, by exposing a ground electrode (not illustrated) into an inner layer of the substrate 20 from the side surface of the substrate and connecting the shield film 70 to the exposed ground electrode.

Then, printing 80 is applied to the top surface 412 of the mounting-type electronic component 41. The printing 80 is formed by recesses of a predetermined pattern formed on the top surface 412 of the mounting-type electronic component 41. The content of the printing 80 is, for example, a manufacturing lot of the electronic component module 10 or the like. Although the shield film 70 is formed on the surface of the printing 80, the printing 80 can be visually recognized with ease from the outer surface of the electronic component module 10 due to the shield film 70 formed along the recesses.

Thus, in the electronic component module 10, since the printing 80 is applied on the top surface 412 of the mounting-type electronic component 41 exposed from the insulating resin 51, the insulating resin 51 needs not have an excessive thickness for printing. The excessive thickness for printing is a thickness necessary for printing with respect to a minimum thickness necessary for securing electrical characteristics and reliability of the electronic component module 10. This can reduce the thickness of the substrate 20 on the side of the first main surface 201, and can reduce the thickness and size of the electronic component module 10.

Note that at this time, as shown in FIG. 1, a thickness D1 of the insulating resin 51 is preferably smaller than a thickness D2 of the insulating resin 52. According to another definition, a distance (corresponding to the thickness D1) between the first main surface 201 and the top surface 412 of the mounting-type electronic component 41 in the thickness direction of the electronic component module 10 is smaller than a distance (corresponding to the thickness D2) between the second main surface 202 and the terminal conductor 61 in the thickness direction of the electronic component module 10.

This allows the electronic component module 10 to have predetermined amounts of the distance between the substrate 20 and another circuit board, and the distance between the mounting-type electronic component 42 and the mounting-type electronic component 43 and another circuit board, while achieving thickness reduction (downsizing), for example. This can suppress electromagnetic field coupling between the substrate 20 and another circuit board, and electromagnetic field coupling between the mounting-type electronic component 42 and the mounting-type electronic component 43 and another circuit board. For example, electronic components for which reliability securement is important are selected as the mounting-type electronic component 42 and the mounting-type electronic component 43, and it is possible to downsize the electronic component module 10 while improving the protection function of these electronic components.

Figure 2:
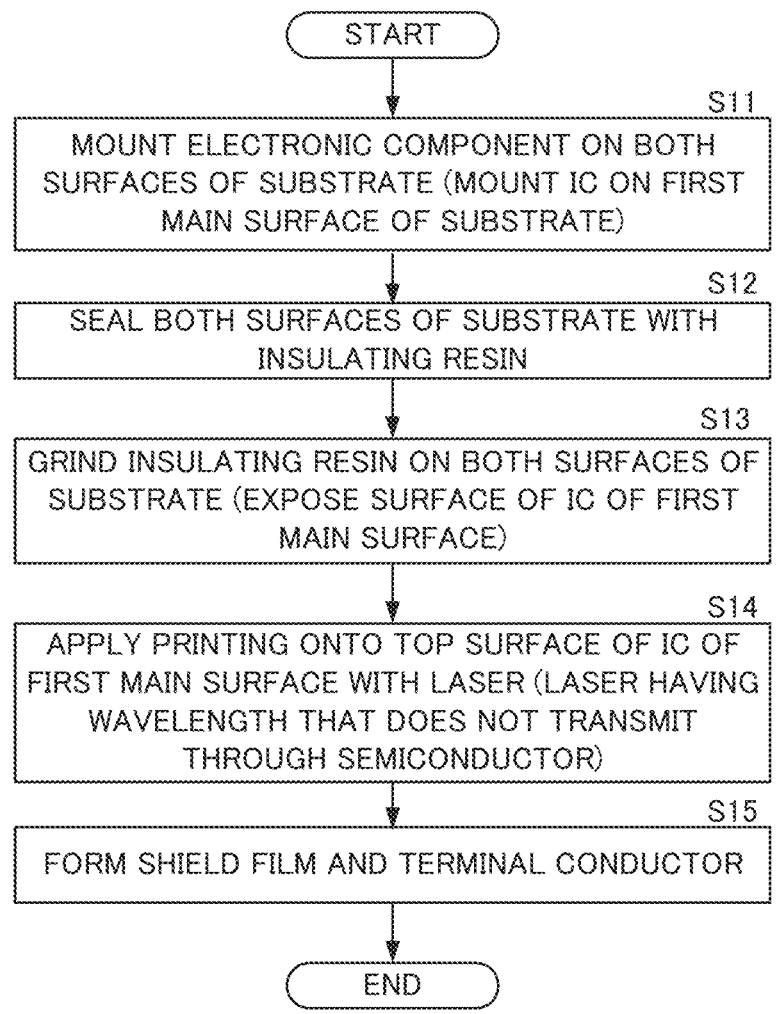
FIG. 2 is a flowchart showing a method for manufacturing the electronic component module according to the first embodiment.

The electronic component module 10 having such a configuration can be achieved by the following method for manufacturing. FIG. 2 is a flowchart showing a method for manufacturing the electronic component module according to the first embodiment. FIGS. 3A, 3B, 3C, and 3D are side sectional views showing the configuration in each step of the manufacturing steps.

Figure 3A:
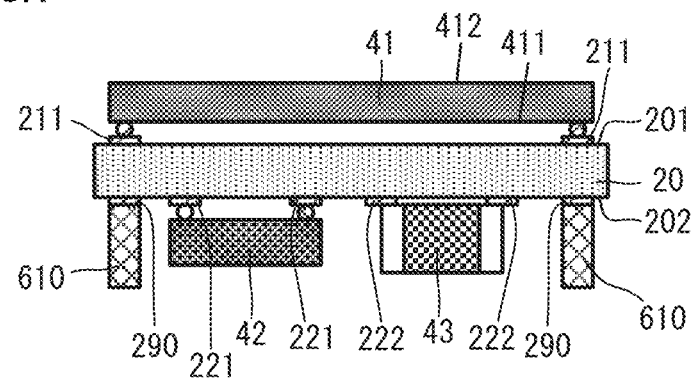
FIGS. 3A, 3B, 3C, and 3D are side sectional views showing the configuration in each step of the manufacturing steps.

First, as shown in FIG. 3A, mounting-type electronic components are mounted on both surfaces of the substrate 20 (S11). More specifically, the mounting-type electronic component 41 including a semiconductor IC is mounted on the first main surface 201 of the substrate 20. The mounting-type electronic component 42, the mounting-type electronic component 43, and the columnar conductor 610 are mounted on the second main surface 202 of the substrate 20.

Figure 3B:
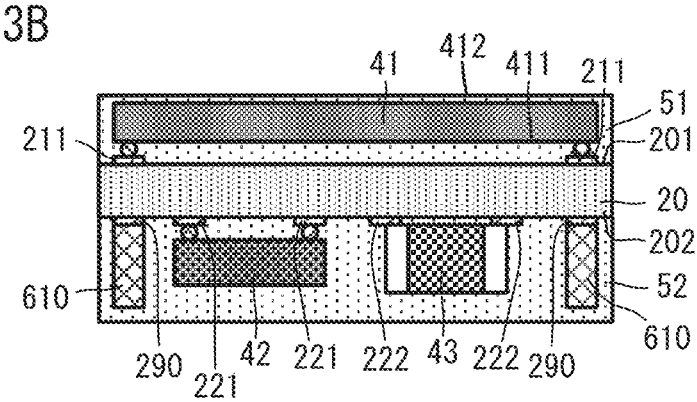

Next, as shown in FIG. 3B, both surfaces of the substrate 20 are sealed with an insulating resin (S12). More specifically, the side of the first main surface 201 of the substrate 20 and the mounting-type electronic component 41 are sealed with the insulating resin 51. At this time, the insulating resin 51 is formed so as to cover the entire mounting-type electronic component 41. The side of the second main surface 202 of the substrate 20, the mounting-type electronic component 42 and the mounting-type electronic component 43, and the columnar conductor 610 are sealed with the insulating resin 52. At this time, the insulating resin 52 is formed so as to cover the entire mounting-type electronic component 42, the entire mounting-type electronic component 43, and the entire columnar conductor 610.

Figure 3C:
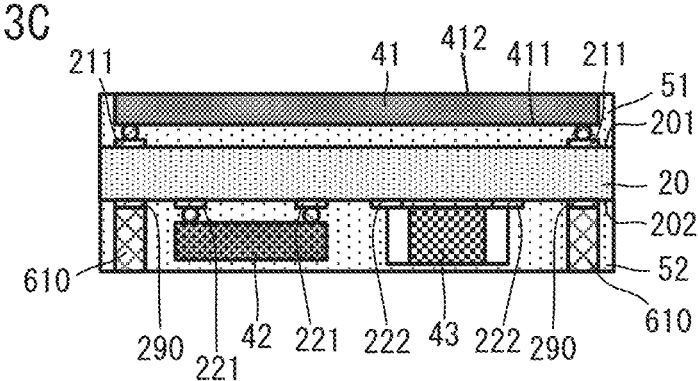

Next, as shown in FIG. 3C, the insulating resin on both surfaces of the substrate 20 is ground (S13). More specifically, on the side of the first main surface 201 of the substrate 20, the insulating resin 51 is ground from the surface of the insulating resin 51 opposite to the contact surface with the first main surface 201 until the top surface 412 of the mounting-type electronic component 41 is exposed. At this time, it is better to grind the mounting-type electronic component 41 to such an extent that no problem occurs in reliability and electrical characteristics of the mounting-type electronic component 41. This can further downsize the electronic component module 10.

On the side of the second main surface 202 of the substrate 20, the insulating resin 52 is ground from the surface of the insulating resin 52 opposite to the contact surface with the second main surface 202 until the columnar conductor 610 is exposed.

Figure 3D:
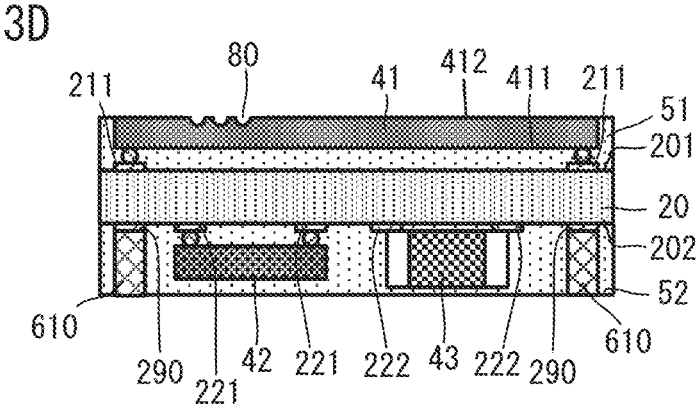

Next, as shown in FIG. 3D, the printing 80 is applied on the top surface 412 of the mounting-type electronic component (S14). More specifically, the top surface 412 of the mounting-type electronic component 41 is irradiated with, for example, laser light, and the top surface 412 is ground in a predetermined pattern. At this time, it is possible to reliably apply the printing 80 by using laser light having a wavelength that does not transmit through the semiconductor substrate (transmittance is low).

Next, the shield film 70 is formed by, for example, sputtering or the like, and the terminal conductor 61 is formed by plating or the like. This makes it possible to manufacture the electronic component module 10 having the configuration shown in FIG. 1.

Second Embodiment

Figure 4:
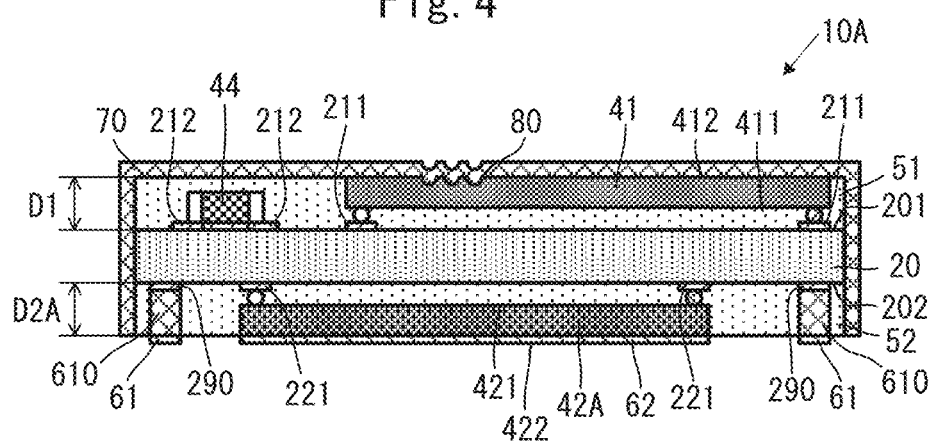
FIG. 4 is a side sectional view showing a configuration of an electronic component module according to a second embodiment.

An electronic component module according to the second embodiment of the present disclosure will be described with reference to the drawings. FIG. 4 is a side sectional view showing the configuration of the electronic component module according to the second embodiment.

As shown in FIG. 4, an electronic component module 10A according to the second embodiment is different from the electronic component module 10 according to the first embodiment in the configuration on the side of the second main surface 202 of the substrate 20. Other configurations of the electronic component module 10A are the same as those of the electronic component module 10, and the description of the same parts will be omitted.

The electronic component module 10A includes a mounting-type electronic component 42A that can be ground and thinned, in place of the mounting-type electronic component 42 and the mounting-type electronic component 43 that cannot be ground. The mounting-type electronic component 42A is an electronic component including a semiconductor similar to the mounting-type electronic component 41, for example, or an electronic component including a piezoelectric body.

The mounting-type electronic component 42A is joined (mounted) to the land conductor 221 on the second main surface 202 of the substrate 20. A top surface 422 of the mounting-type electronic component 42A facing a mounting surface 421 is exposed to the outside from the insulating resin 52. For example, as shown in FIG. 4, a ground conductor 62 may be formed on the top surface 422 of the mounting-type electronic component 42A.

In such a configuration, the side of the second main surface 202 of the substrate 20 can also be thinned by grinding similarly to the side of the first main surface 201. For example, a thickness D2A on the side of the second main surface 202 can be made equal to the thickness D1 on the side of the first main surface 201. This can further downsize the electronic component module 10A.

Note that, similarly to the above-described side of the first main surface 201, it is possible to also achieve the configuration of the electronic component module 10A by grinding the side of the second main surface 202 until the mounting-type electronic component 42A is exposed.

In the second embodiment, a land conductor 212 is formed on first main surface 201, and a mounting-type electronic component 44 is mounted on the land conductor 212. The mounting-type electronic component 44 is a mounting-type electronic component that cannot be ground. The mounting-type electronic component 44 may be mounted on the first main surface 201 as long as the height of the mounting-type electronic component 44 is equal to or less than the thickness of the mounting-type electronic component 41 having been ground. Note that also the side of the second main surface 202 can be mounted similarly as long as the height of the mounting-type electronic component that cannot be ground is equal to or less than the thickness of the mounting-type electronic component that can be ground having been ground.

Third Embodiment

Figure 5:
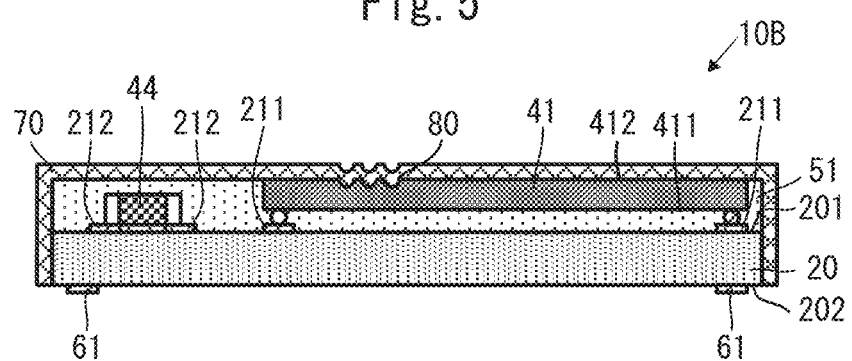
FIG. 5 is a side sectional view showing a configuration of an electronic component module according to a third embodiment.

An electronic component module according to the third embodiment of the present disclosure will be described with reference to the drawings. FIG. 5 is a side sectional view showing the configuration of the electronic component module according to the third embodiment.

As shown in FIG. 5, an electronic component module 10B according to the third embodiment is different from the electronic component module 10A according to the second embodiment in that a mounting-type electronic component is mounted only on the side of the first main surface 201 of the substrate 20 and a mounting-type electronic component is not mounted on the side of the second main surface 202. Other configurations of the electronic component module 10B are the same as those of the electronic component module 10A, and the description of the same parts will be omitted.

The mounting-type electronic component 41 and the mounting-type electronic component 44 are mounted on the first main surface 201 of the substrate 20. The insulating resin 51 covers the side of the first main surface 201 of the substrate 20. At this time, the top surface 412 of the mounting-type electronic component 41 is not covered with the insulating resin 51 and is exposed to the outside. Printing 80 is applied to the top surface 412 of the mounting-type electronic component 41. Then, the shield film 70 is formed so as to include the top surface 412 of this mounting-type electronic component 41 and cover the entire side of the first main surface 201 of the substrate 20.

Thus, the electronic component module 10B has a configuration of a so-called single-sided mounting substrate. Even with such a configuration of single-sided mounting substrate, it is possible to achieve the same operational effects as those of the above-described electronic component modules 10 and 10A.

In each of the above embodiments, an aspect in which one mounting-type electronic component that can be ground is mounted on the main surface has been described. However, a plurality of mounting-type electronic components that can be ground may be mounted. The number of mounting-type electronic components that cannot be ground is not limited to that of the above-described embodiments.

10, 10A, 10B electronic component module
20 substrate
41, 42, 42A, 43, 44 mounting-type electronic component
51, 52 insulating resin
61 terminal conductor
62 ground conductor
70 shield film
80 printing
201 first main surface
202 second main surface
211, 212, 221, 222 land conductor
290 external connection terminal conductor
411 mounting surface
412 top surface
421 mounting surface
422 top surface
610 columnar conductor

The invention claimed is:

1. An electronic component module comprising:
a substrate having a first main surface and a second main surface, a side of the second main surface being a mounting side;
a first electronic component mounted on the first main surface; and
a first insulating resin covering the first main surface and the first electronic component, wherein:
the first electronic component is an electronic component including a semiconductor;
a surface of the semiconductor of the first electronic component opposite to a surface facing the first main surface is exposed from the first insulating resin;
printing is applied to an exposed surface of the semiconductor;
a conductive shield film covering a surface of the first insulating resin and the exposed surface of the semiconductor is provided;
the printing is provided by recesses;
the conductive shield film is provided along the recesses; and
the conductive shield film closely contacts with the recesses.

2. The electronic component module according to claim 1, further comprising:
a second electronic component mounted on the second main surface; and
a second insulating resin covering the second main surface and the second electronic component.

3. The electronic component module according to claim 2, wherein the shield film further covers a side surface of the substrate and a side surface of the second insulating resin.

4. The electronic component module according to claim 2, wherein:
the second electronic component is an electronic component including a semiconductor or a piezoelectric body; and
a surface of the second electronic component opposite to a surface facing the second main surface is exposed from the second insulating resin.

5. The electronic component module according to claim 2, wherein a thickness of the first insulating resin is less than a thickness of the second insulating resin.

6. A method for manufacturing the electronic component module according to claim 2, comprising the steps of:
mounting the first electronic component including the semiconductor on the first main surface of the substrate and mounting the second electronic component on the second main surface of the substrate;
covering the first main surface and the first electronic component with the first insulating resin and covering the side of the second main surface and the second electronic component with the second insulating resin;
exposing the semiconductor of the first electronic component by grinding the first insulating resin from a surface of the first insulating resin opposite to a surface in contact with the first main surface;
applying printing by irradiating an exposed surface of the semiconductor with a laser having a wavelength not transmitting the semiconductor.

7. The electronic component module according to claim 3, wherein:
the second electronic component is an electronic component including a semiconductor or a piezoelectric body; and
a surface of the second electronic component opposite to a surface facing the second main surface is exposed from the second insulating resin.

8. The electronic component module according to claim 3, wherein a thickness of the first insulating resin is less than a thickness of the second insulating resin.

9. The electronic component module according to claim 4, wherein a thickness of the first insulating resin is less than a thickness of the second insulating resin.

* * * * *